(12) United States Patent
Poplack

(10) Patent No.: US 9,015,026 B2
(45) Date of Patent: Apr. 21, 2015

(54) SYSTEM AND METHOD INCORPORATING AN ARITHMETIC LOGIC UNIT FOR EMULATION

(75) Inventor: Mitchell Poplack, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 730 days.

(21) Appl. No.: 12/814,333

(22) Filed: Jun. 11, 2010

(65) Prior Publication Data

US 2010/0318952 A1 Dec. 16, 2010

Related U.S. Application Data

(60) Provisional application No. 61/186,712, filed on Jun. 12, 2009.

(51) Int. Cl.
*G06F 9/455* (2006.01)
*G06F 17/50* (2006.01)

(52) U.S. Cl.
CPC ........ *G06F 17/5022* (2013.01); *G06F 17/5045* (2013.01); *G06F 17/5027* (2013.01)

(58) Field of Classification Search
USPC .......................................................... 703/23
See application file for complete search history.

(56) References Cited

U.S. PATENT DOCUMENTS

| | | | |
|---|---|---|---|
| 3,891,974 A * | 6/1975 | Coulter et al. ................... | 703/23 |
| 3,997,895 A * | 12/1976 | Cassonnet et al. ............... | 703/27 |
| 4,394,725 A * | 7/1983 | Bienvenu et al. .............. | 718/106 |
| 4,432,051 A * | 2/1984 | Bogaert et al. ................ | 717/127 |
| 4,527,234 A * | 7/1985 | Bellay .............................. | 703/28 |
| 5,036,473 A | 7/1991 | Butts et al. | |
| 5,097,413 A * | 3/1992 | Mensch, Jr. ...................... | 714/24 |
| 5,109,353 A | 4/1992 | Sample et al. | |
| 5,475,830 A | 12/1995 | Chen et al. | |
| 5,551,013 A | 8/1996 | Beausoleil et al. | |
| 5,678,030 A | 10/1997 | Sferrazza et al. | |
| 5,680,583 A | 10/1997 | Kuijsten | |
| 5,832,205 A * | 11/1998 | Kelly et al. ...................... | 714/53 |
| 5,926,832 A * | 7/1999 | Wing et al. .................... | 711/141 |
| 5,958,061 A * | 9/1999 | Kelly et al. ....................... | 714/1 |
| 5,960,191 A | 9/1999 | Sample et al. | |
| 6,011,908 A * | 1/2000 | Wing et al. ...................... | 714/19 |
| 6,031,992 A * | 2/2000 | Cmelik et al. ................. | 717/138 |
| 6,035,117 A | 3/2000 | Beausoleil et al. | |
| 6,051,030 A | 4/2000 | Beausoleil et al. | |

(Continued)

OTHER PUBLICATIONS

Jason Andrews, Modern Simulation Acceleration and Emulation Technology, Nov. 2005, Incisive Verification Article, pp. 1-9.*

(Continued)

*Primary Examiner* — Kamini S Shah
*Assistant Examiner* — Juan Ochoa
(74) *Attorney, Agent, or Firm* — Dickstein Shapiro LLP

(57) ABSTRACT

A system and method for verifying logic circuit designs having arithmetic operations and complex logical operations such that the operations may be evaluated at substantially full hardware speed is disclosed. According to one embodiment, a system for verifying the functionalities of an electronic circuit design comprises hardware emulation resources emulating at least a portion of an electronic circuit design; and a first hardware ALU block having an arithmetic logic unit that performs an arithmetic operation or a complex logical operation of the electronic circuit design, and a set of flag registers that contains a conditional value for enabling the arithmetic logic unit.

39 Claims, 12 Drawing Sheets

(56) References Cited

U.S. PATENT DOCUMENTS

| | | | |
|---|---|---|---|
| 6,199,152 B1 * | 3/2001 | Kelly et al. | 711/207 |
| 6,556,936 B2 | 4/2003 | Gooding et al. | |
| 6,651,225 B1 | 11/2003 | Lin et al. | |
| 6,754,763 B2 | 6/2004 | Lin | |
| 6,901,581 B1 | 5/2005 | Schneider | |
| 6,985,848 B2 | 1/2006 | Swoboda et al. | |
| 7,103,530 B1 | 9/2006 | Bartz et al. | |
| 7,290,228 B2 | 10/2007 | Guenther et al. | |
| 7,325,164 B2 | 1/2008 | Swanson et al. | |
| 7,379,860 B1 | 5/2008 | Bartz et al. | |
| 7,653,848 B2 | 1/2010 | Abernathy et al. | |
| 7,716,452 B1 * | 5/2010 | Kelly et al. | 711/206 |
| 7,739,093 B2 | 6/2010 | Beausoleil et al. | |
| 7,840,776 B1 * | 11/2010 | Kelly et al. | 711/207 |
| 7,930,165 B2 | 4/2011 | Weiss et al. | |
| 8,055,877 B1 * | 11/2011 | Kelly et al. | 711/206 |
| 8,103,496 B1 * | 1/2012 | Roe et al. | 703/28 |
| 8,103,497 B1 * | 1/2012 | Nemecek et al. | 703/28 |
| 2002/0152060 A1 | 10/2002 | Tseng | |
| 2004/0153304 A1 | 8/2004 | Agarwala et al. | |
| 2004/0153813 A1 | 8/2004 | Swoboda | |
| 2005/0038550 A1 * | 2/2005 | Sato | 700/121 |
| 2005/0102125 A1 | 5/2005 | Tseng | |
| 2005/0267732 A1 | 12/2005 | Beausoleil et al. | |
| 2006/0117274 A1 | 6/2006 | Tseng et al. | |
| 2006/0168367 A1 | 7/2006 | Beckett et al. | |
| 2007/0226795 A1 | 9/2007 | Conti et al. | |
| 2009/0106604 A1 | 4/2009 | Lange et al. | |

OTHER PUBLICATIONS

Ray Turner, A Primer on Processor-Based Emulation, Oct. 21, 2004, EE Times, pp. 1-12.*

Ray Turner, Learn How Processor-Based Emulation Works, Nov. 1, 2005, eetindia.com, pp. 1-6.*

Chiou et al., The Fast Methodology for High-speed SoC-computer Simulation, 2007, Pre-print: To appear in ICCAD 2007, pp. 1-8.*

Park et al., "Improve Debugging and Performance Tuning With ETW", Apr. 2007, MSDN Magazine, accessed on Sep. 20, 2013, accessed from http://msdn.microsoft.com/en-us/magazine/cc163437.aspx, pp. 1-12.

* cited by examiner

```
module receiver (...)
       .
       .
       .
       .
    if (r_busy) begin                    ╱──101
       rs_cnt <= rs_cnt + 1;
       // for sampling middle of data
       if (rs_cnt == 4) begin
          if ((r_d == 1) && (r_cnt == 0)) begin
             receive_busy <= 0;
          end else begin         ╱──102
             r_cnt <= r_cnt + 1;
             // initiate storing the received data
     ⎧     if (r_cnt > 0 && r_cnt < 9) begin
 107 ⎨        rs_cnt <= rs_cnt + 2;        ──105
     ⎩     end
                    ╱    ╲          ╲
                  104    106         103
       .
       .
       .
    endmodule
```

FIG. 1

| Mnemonic | OPCODE | Data Result | Cout | Comments |
|---|---|---|---|---|
| STORE | 00000 | If cin==0, r=a If cin==1, r=~a | If cin==0, a[31] If cin==1, ~a[31] | allows value to be stored. |
| INCR | 00001 | If cin==0, r=a+1 If cin==1, r=a-1 | Carry-out | |
| NEG | 00010 | ~b | 0 | two's complement (~b+1) |
| ADD | 00011 | a+b+cin | Carry-out | |
| SUB | 00100 | a-b-cin | Borrow-out | EQZ, GTZ, GEZ provide (a==b), (a>b), and (a>=b) |
| ADDH | 00101 | a[0:15]+b[0:15], a[16:31]+b[16:31]+cin | Carry-out from top | Half-width adder. Performs two parrallel 16-bit additions. |
| SUBH | 00110 | a[0:15]-b[0:15], a[16:31]-b[16:31]-cin | Borrow-out from top | Half-width subtractor. Performs two parallel 16-bit subtractions. |
| SHL | 00111 | a<<b[27:31] | a[0] | |
| SHR | 01000 | a>>b[27:31] | a[31] | cin selects arithmetic(1) or logical (0); can be used as a 32:1 multiplexer. |
| BSHL | 01001 | a(bar<<) b[27:31] | result [0] | left barrel shift |
| BSHR | 01010 | a(bar>>) b[27:31] | result [31] | right barrel shift |
| AND | 01011, | bitwise F(a,b) | Reduction across all 64 input bits (negated if cin==1) | bitwise operations: a&b, a\|b, a&~b, a^b ~(a&b), ~(a\|b), ~a\|b, ~(a^b) (Trivial functions a,b,0,1 and functions obtainable by swapping a and b are removed). |
| OR | 01100, | if cin==1, result is negated. | | |
| ANDB | 01101, | | | |
| XOR | 01110 | | | |
| FSTORE FAND FOR FANDB FXOR | 01111, 10000, 10001, 10010, 10011 | Values unchanged | Flagwise F(a,b). If cin==1, output is negated. | Perform logic operations on flag bits. Registers themselves will no be altered. This allows logic manipulation of flag bits to create complex conditions. |
| BMUX | 10100 | cin?b:a | cin? b[31] : a[31] | 32-bit bus multiplexer |
| MULT | 10101 | No change for current instruction; In 35 steps, result is a^b | No change for current instruction; '0' in 35 steps. | 64-bit result will be returned on two adjacent steps. Result is the least significant 32 bits. To access next significant 32 bits, use SELU. Latency is 36 steps. Multiplier is not pipelined (no overlapping multiplications allowed). |
| DIV | 10110 | a/b, a#b | 1 if divide by zero occurred. | Latency will be 32 steps. Divider is not pipelined (no overlapping divisions allowed). Result is the quotient (a/b). To access the remainder (a&p), use SELU. |

*FIG. 11*

| | | | | |
|---|---|---|---|---|
| SELU | 10111 | (select upper) | 0 | Selects upper 32 bits of last completed multiplication, or remainder of last completed division. The behavior of this operation may be undefined if a multiplication or division is in progress. |
| CNT1 | 11000 | # of '1's | If cin==1, 1 if count is 0 or 1; If cin==0, 1 if count == exactly 1. | Returns the number of ones in "a" |
| RIGHT1 | 11001 | Index of rightmost '1'; if no '1' found, result is -1. (0xFFFFFFFF) | 1 if no '1' found. | (LSB is bit zero) Returns index of rightmost '1' in "a" |
| LFSR | 11010 | result [1:31] = a>>1 result [0] = ^ (a&b)^cin | ^ (a&b) | Linear Feedback Shift Register function. |
| FSAWR | 11100 | 0 | Old semaphor value | FSA syncronization register write: Writes data selected by SELB to local FSA register selected by SELA and sets semaphor. If cin==0, this does not occur unless the semaphor is already unset. Cout returns the old state of the semaphor. Cout is stored just like FSTORE. |
| FSARD | 11101 | FSA reg data | Old value of semaphor | FSA syncronization register read: Reads data from remote FSA register selected by SELA and unsets semaphor. Cout returns old state of the semaphor. Cout and the data are stored to ALU register selected by SELR. |
| FSATST | 11110 | 0 | Value of semaphor | FSA syncronization register test: Cout becomes the state of the semaphor associated with FSA register selected by SELA. Cout is stored just like FSTORE. |
| LBRANCH | 11111 | No store (Output value is unchanged) | No store (Outputs are unchanged) | Load FSA Branch register from "a" (eqz,gtz,gez remain unchanged as well) |

*FIG. 12*

SYSTEM AND METHOD INCORPORATING AN ARITHMETIC LOGIC UNIT FOR EMULATION

The present application claims the benefit of and priority to U.S. Provisional Patent Application No. 61/186,712 filed on Jun. 12, 2009, entitled "Method and System for Improving Simulation Acceleration," which is herein incorporated by reference.

FIELD

The field of this disclosure relates to hardware and software verification of logic circuits, and particularly, to verification using an arithmetic logic unit.

BACKGROUND

Electronic design automation (EDA) tools are used for designing, verifying, and implementing electronic systems and component circuits. Within an electronic system, hundreds of integrated circuits, or "chips", may be interconnected on one or more printed circuit boards (PCBs). Today, an integrated circuit can easily comprise billions of interconnected transistors to enable a set of intended functions. Without EDA tools, it would be impractical, if not impossible, to produce and commercialize an integrated circuit of such complexity. Integrated circuits continue to become more complex (i.e.—increasing number of transistors) with each successive generation of process technology, allowing more transistors to exist on a footprint of the same or smaller size. Increase in complexity generally translates to longer times for designing, verifying, and implementing a chip design. There exists a need for advances in EDA tool technology to keep chip development within a competitive timeline.

The design process for an integrated circuit generally entails describing the circuit's intended behavior at the register transfer level (RTL) using a hardware description language, such as VHDL, or Verilog, and then reducing the RTL design description into a physical layout of transistor gates. However, because the design is implemented to describe the functions of, perhaps, millions or billions of interconnected transistors, errors may be inevitable. Thus, the design needs to be verified to ensure that it behaves exactly the way the designers intended. One possible approach is to reduce the RTL code to a physical layout, fabricate a prototype chip, and then test it in the intended environment. However, the impracticality of such an approach goes without saying in the industry, given the turnaround time, the cost of manufacturing, and the number of design revisions that may be required to perfect the design.

Today, verification engineers utilize a range of EDA tool technologies for logic verification that are far more practical than prototyping. One such technology is software simulation, which refers to running an RTL design through a computer program, a "software simulator", on a general purpose computer or workstation to simulate the operations of the circuit design. Even though software simulation offers faster turnaround time compared to manufacturing an actual device, simulating a complex circuit design can still be painstakingly slow and can take up to months or more to finish. Indeed, it can take many hours or even several days to simulate just a small number of clock cycles of a typical design if a software simulator is used. This is because a typical workstation relies on a single processor to simulate these operations in a sequential or semi-sequential manner. In contrast, most of the operations on a fabricated chip are performed in parallel.

Hardware emulation is a logic verification technology that typically offers the fastest verification speed because a considerable number of operations may be performed in parallel. Parallel execution is achieved by mapping substantially the entire circuit design onto the emulation resources of a hardware platform. Additionally, with hardware emulation, the hardware platform can run almost independently from a workstation because almost all of the verification environment is placed on the hardware platform. Without having to wait for data input from the workstation, the user's design running in the emulator can operate at substantially full hardware speeds. However, the speed enhancement is not without cost. Because almost the whole design would need to be mapped onto the hardware platform, the complexity of the design is generally limited by the emulation resource capacity of the hardware platform.

Simulation acceleration offers a middle ground in terms of verification speed and emulation capacity between software simulation and hardware emulation by separately executing a software portion and a hardware portion of the design. Code apportionment is performed by a compiler in a workstation at compile time. The hardware portion of the design is mapped onto the emulation resources of the hardware emulation system, which executes the code in a substantially parallel manner, while the software portion of the design runs in the software simulator on the workstation. The workstation is connected to and works in conjunction with the hardware platform to verify the circuit logic through the exchange of simulation data. Because the hardware platform may have to wait for data input from the workstation, verification speed is determined in part by the percentage of the design remaining on the workstation and the communication channel width and latency between the workstation and the hardware platform.

SUMMARY

A system and method for verifying logic circuit designs having arithmetic operations and complex logic operations. According to one embodiment, a system for verifying the functionalities of an electronic circuit design comprises hardware emulation resources emulating at least a portion of an electronic circuit design; and a first hardware ALU block having an arithmetic logic unit that performs an arithmetic operation or a complex logical operation of the electronic circuit design, and a set of flag registers that contains a conditional value for enabling the arithmetic logic unit and otherwise modifying an instruction.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

FIG. 1 illustrates exemplary Verilog code that includes arithmetic operations;

FIGS. 11 and 12 lists an exemplary list of OPCODE's and their corresponding functions, according to one embodiment.

Figure 2A:
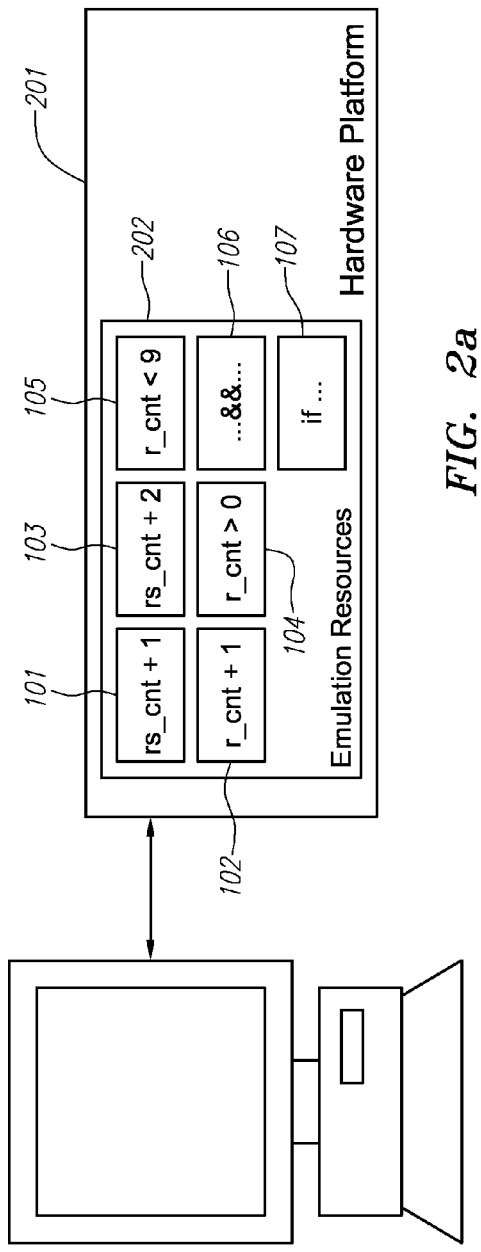
FIGS. 2A-2B illustrate systems and methods of the related art for verifying logic circuit designs containing arithmetic operations.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

Hardware emulation systems and simulation acceleration systems are collectively referred to as emulation systems in the subsequent sections. Such emulation systems are commercially available from various vendors, such as Cadence Design Systems, Inc. headquartered in San Jose, Calif.

Typical emulation systems utilize either interconnected programmable logic chips or interconnected processor chips. Examples of hardware logic emulation systems using programmable logic devices are disclosed in, for example, U.S. Pat. No. 5,109,353, entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 5,109,353, 5,036,473, 5,475,830 and 5,960,191 are incorporated herein by reference. Examples of hardware logic emulation systems using processor chips are disclosed in, for example, U.S. Pat. No. 5,551,013 entitled "Multiprocessor for hardware emulation," U.S. Pat. No. 6,035,117 entitled "Tightly coupled emulation processors," and U.S. Pat. No. 6,051,030 entitled "Emulation module having planar array organization." U.S. Pat. Nos. 5,551,013, 6,035,117 and 6,051,030 are incorporated herein by reference.

Figure 2B:
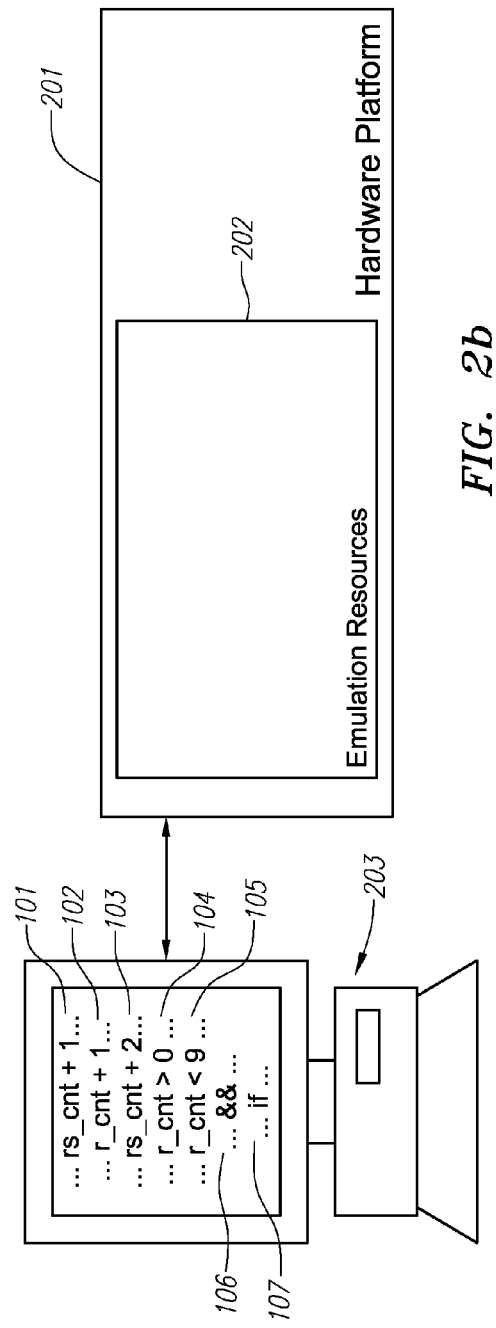

An RTL design may often contain complex logical operations as well as arithmetic operations such, as 'addition', 'subtraction', 'multiplication', and 'division'. One familiar example involving an arithmetic operation is the implementation of an incrementing or decrementing counter. Arithmetic operations may be evaluated by the workstation or by the hardware platform. FIG. 1 illustrates exemplary Verilog design code containing arithmetic operations 101, 102, and 103, arithmetic comparisons 104 and 105, and logical combinations 106 and 107. While only several lines of code are shown, a typical logic circuit design may contain hundreds of thousands or even millions of lines of code. Thus, it is easy to imagine that a typical logic circuit design may contain at least several hundred arithmetic and complex logical operations. Signal processing and graphics applications, in particular, heavily utilize arithmetic operations. FIGS. 2a and 2b illustrate how emulation systems of the related art may handle the operations found in FIG. 1.

One approach is to map each of the operations 101-107 onto the hardware platform 201 as shown in FIG. 2a. Emulation resources 202 are utilized to emulate each of the arithmetic and complex logical operators at the gate level for operations 101-107. In this case, two adders, one subtractor, and two comparison operators would be emulated at the gate level. This allows the hardware platform to evaluate the operations substantially in parallel, which dramatically increases the emulation system's operating speed. However, because emulation resources on a hardware platform may be physically limited and expensive to upgrade, mapping the arithmetic operations onto the emulation resources of the hardware platform comes at the cost of reducing the emulation capacity available for other logic.

FIG. 2b illustrates another approach of using the workstation 203 to evaluate operations 101-107. There are also drawbacks to this approach because, as mentioned earlier, the workstation 203 generally operates in a sequential or semi-sequential manner, and consequently, operates significantly slower than the hardware platform 201. In addition, if the hardware emulated portion of the design code relies on the results of the operations 101-107, the results would need to be communicated to the hardware platform. Thus, the hardware platform 201, having to wait for data from the workstation 203, may not run at full hardware speed.

Furthermore, as previously mentioned, the fastest emulation technology operates by evaluating a large number of Boolean (single-bit) functions in parallel, such as is done on a hardware platform. In contrast, a general purpose workstation relies on a single processor to evaluate Boolean functions in a sequential or semi-sequential manner. Therefore, because arithmetic operations, such as multiplication and division, and complex logical operations, such as arithmetic comparison, involve very complicated interconnected functions among many bits, performing these operations is usually very resource-intensive and takes considerable time for a general purpose workstation.

In view of the foregoing, there exists a need for a system and method for verifying logic circuit designs containing arithmetic and/or complex logical operations such that these operations may be evaluated at substantially full hardware speed without exhausting the emulation resources of the hardware platform.

Figure 3:
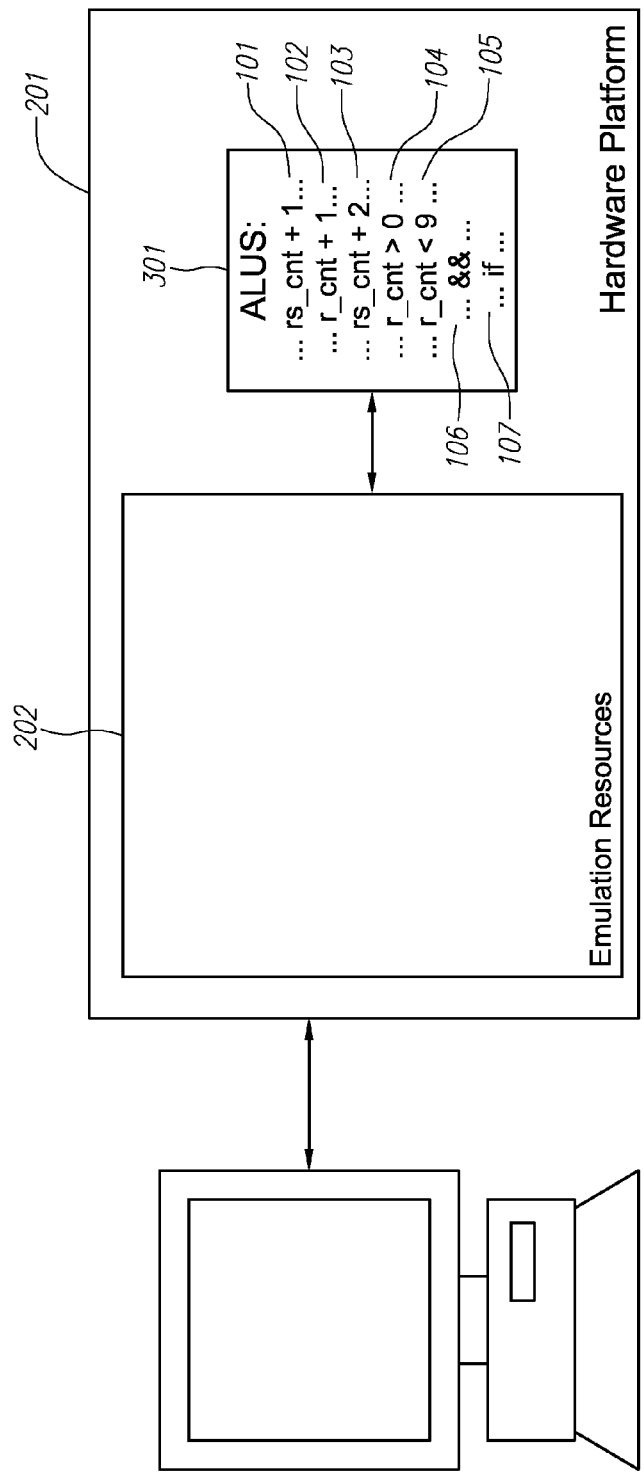
FIG. 3 illustrates a high-level functional view of the presently disclosed system incorporating a set of ALUs, according to one embodiment.

The system and method presently disclosed allows the arithmetic and complex logical operations in a logic circuit design to be evaluated at substantially full hardware speed without utilizing the emulation resources of the hardware platform. FIG. 3 illustrates a high-level functional view of the presently disclosed system incorporating a set of ALUs (arithmetic logic units) 301, according to one embodiment. The set of ALUs 301 is incorporated in the hardware platform 201 and supplements the emulation resources 202. As shown in the figure, arithmetic operations 101, 102, and 103, as well as complex logical operations 104 and 105, may be evaluated using the set of ALUs 301, as opposed to using individually emulated operators or the workstation. Because the set of ALUs 301 is implemented as dedicated hardware, the arithmetic and complex logical operations may be evaluated at substantially full hardware speed. Furthermore, because the set of ALUs 301 communicates almost directly with the emulation resources 201, the emulation resources can access the evaluated results with little or nearly no latency.

Implementation

Figure 4:
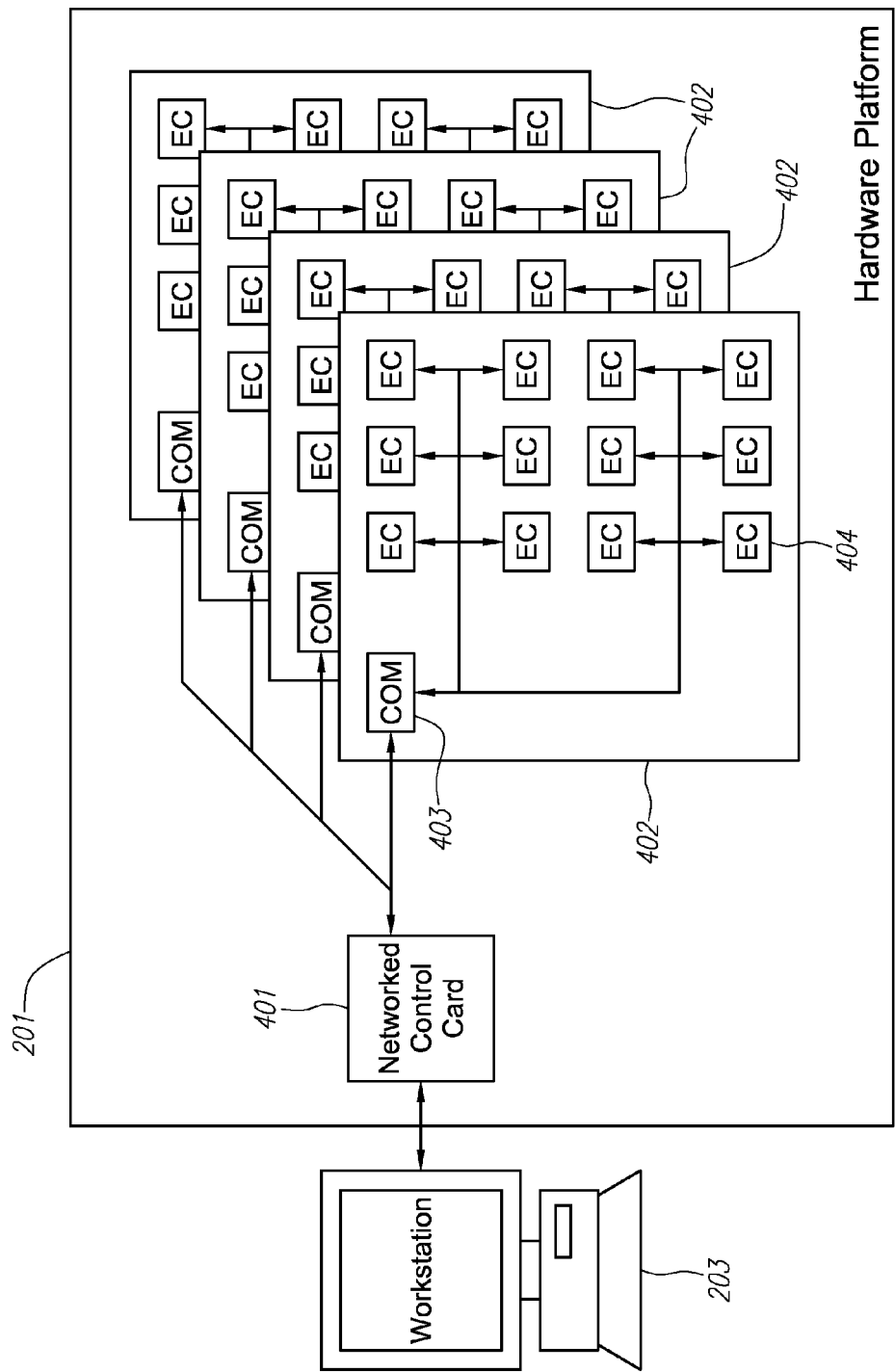
FIG. 4 illustrates an exemplary implementation of the presently disclosed system, according to one embodiment.

FIG. 4 illustrates an exemplary implementation of the presently disclosed system, according to one embodiment. A hardware platform 201 includes a networked control card 401 to allow the host workstation 203 to interface with four multi-chip modules 402. Each multi-chip module 402 includes a communications chip 403 and twelve emulation chips 404. Each communications chip 403 further serves as an interface for the networked control card 404, and hence the host workstation 203, to communicate with each of the emulation chips 404 within a multi-chip module 402. Consistent with one embodiment of an emulation chip shown in FIG. 5, each emulation chip 404 may contain 256 emulation processors and two ALU blocks.

Figure 5:
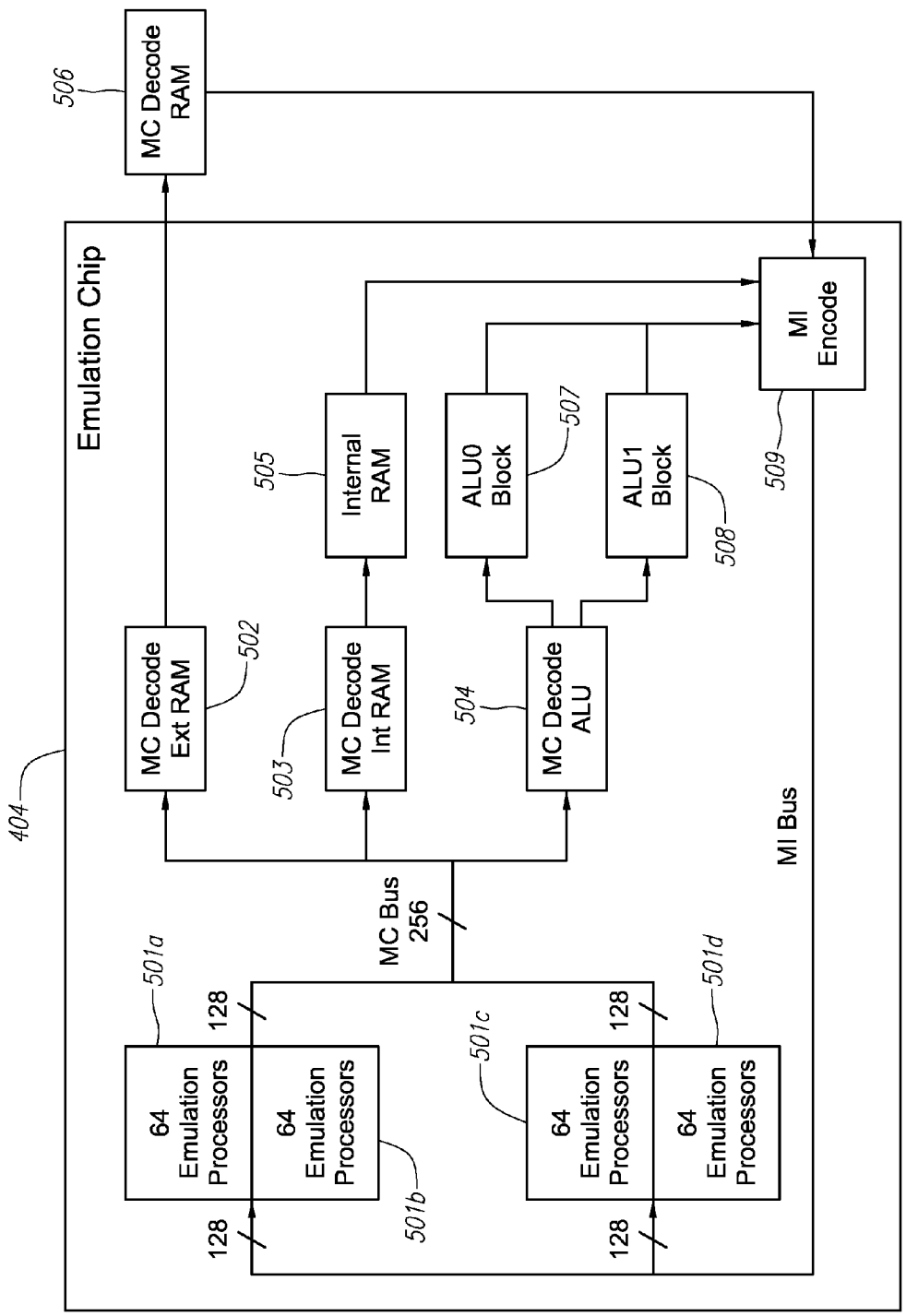
FIG. 5 illustrates an exemplary emulation chip of the presently disclosed system, according to one embodiment.

As FIG. 5 further illustrates, the 256 emulation processors in each emulation chip 404 may be arranged in four clusters 501a-501d of 64 processors. It may be convenient to consider the emulation processors as belonging to two 'halves'. For instance, processor clusters 501a and 501b together may drive a first set of 128 bits (0 to 127) on the memory controller (MC) bus to access internal RAM 505, external RAM 506, ALU0 module 507, or ALU1 module 508. Similarly, processor clusters 501c and 501d together may drive a second set of 128 bits (128 to 511) on the MC bus to access internal RAM 505, external RAM 506, ALU0 module 507, or ALU1 module 508.

A designated set of control bits in each set of 128 MC bus bits may be used to indicate which decode logic to activate and when to activate. For example, an EXTRAM bit may be used to indicate whether decode logic 502 is being activated. Decode logic 502 is activated when accessing the external RAM 506. An INTRAM bit may be used to indicate whether decode logic 503 is being activated. Decode logic 503 is activated when accessing the internal RAM 505. An ALU bit may be used to indicate whether decode logic 504 is being activated. Decode logic 504 is activated when accessing either ALU0 module 507 or ALU1 module 508. An MC_STROBE bit may be used to indicate when the decode logic is activated. Under this implementation, asserting both the MC_STROBE bit and the ALU bit activates the ALU decode logic 504.

One of ALU0 module 507 or ALU1 module 508 or both modules may be selected for operation after ALU decode logic 504 is activated. One designated control bit in each set of 128 MC bus bits may be used to select between accessing ALU0 module 507 and ALU1 module 508. Upon receiving the necessary data and control inputs from the MC bus (relayed by the ALU decode logic 504), the ALU block (whichever ALU0 or ALU1 is selected) may process the data and output the result to MI encode logic 509. MI encode logic is used to replicate the data result on the MI bus. For instance, a 32-bit data result may be replicated on the MI bus such that the 32-bit value is driven on each of the following set of MI bus lines: 0-31, 32-63, 64-95, 96-127, 128-159, 160-191, 192-223, and 224-255. Each MI bus line corresponds to one of the 256 processors. Because data results are replicated in this or similar manner, data results on the MI bus may be accessed by any one of the four processor clusters 501a-501d. Allowing ALU0 module 507 and ALU1 module 508 to share the MC bus and the MI bus with other memory elements (e.g.—DRAM, external memory) eliminates the need for an additional data or control bus to interface with the ALU blocks and effectively reduces the layout complexity and the size of each emulation chip.

Figure 6:
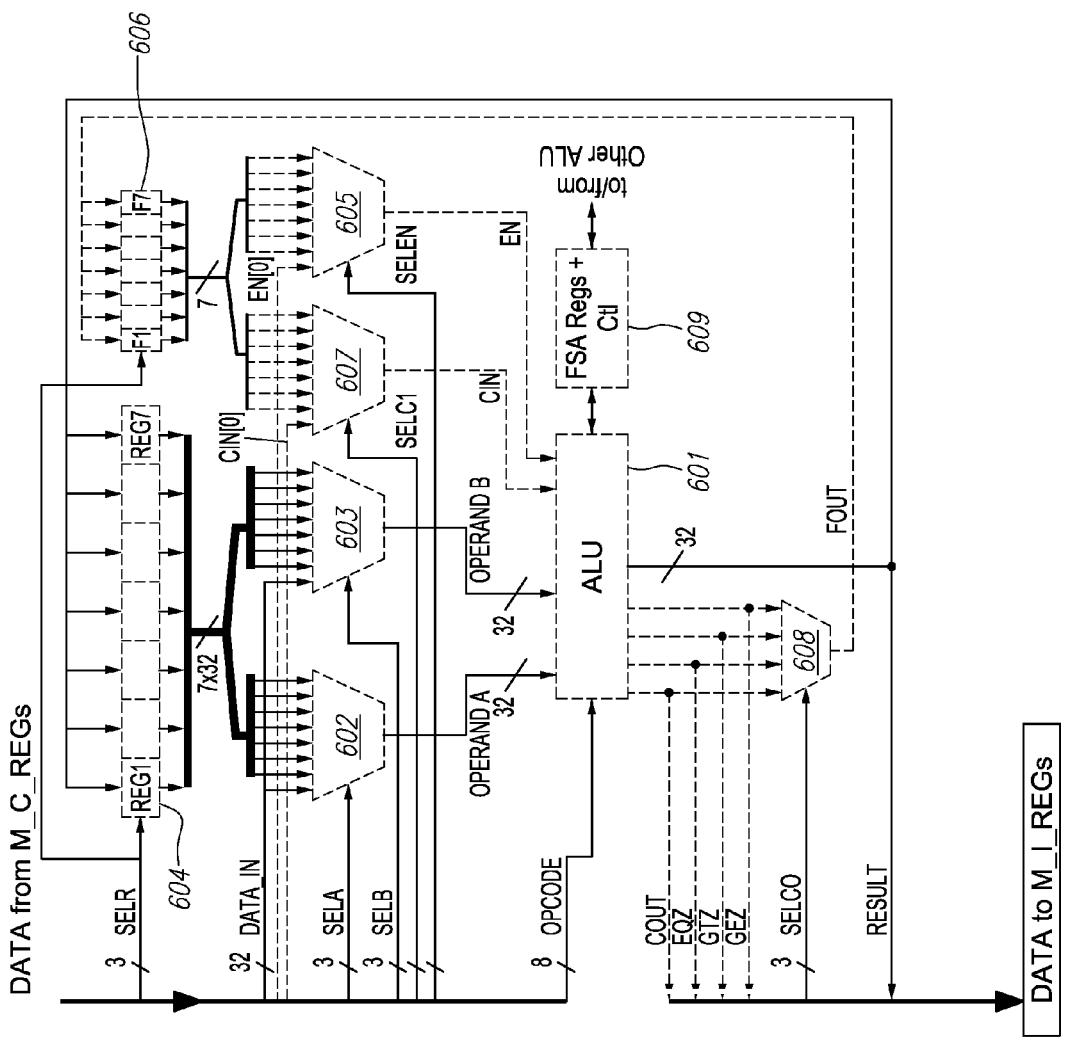
FIG. 6 illustrates an exemplary implementation of an ALU block at the datapath and register level, according to one embodiment.

FIG. 6 illustrates an exemplary implementation of an ALU block at the datapath and register level, according to one embodiment. ALU 601 performs an operation when the instruction enable EN signal is asserted. SELEN, a 3-bit input into mux 605 from the MC bus, selects the source of the EN signal, which may be supplied by the MC bus as EN[0] or by one of seven 1-bit flag registers 606. The operation may be performed on 32-bit operands OPERAND_A and OPERAND_B, provided by mux 602 and mux 603, respectively. A 5-bit OPCODE input into the ALU 601 determines the operation being performed. For instance, a binary OPCODE value of 00011'b indicates to the ALU 601 to add OPERAND_A and OPERAND_B. As mentioned earlier, data and control inputs into the ALU block, such as the OPCODE and DATA_IN, are made available on the MC bus in memory control registers (MC_REGS) by processor clusters. Using processor clusters to control the operations of an ALU allows for maximum and dynamic configurability (e.g., not only the data but also the OPCODE can be modified by the DUT). An exemplary list of OPCODE's and their corresponding functions may be found in FIGS. 11 and 12. Some operations may involve one or neither of the operands. The data result of an operation is outputted as RESULT by ALU 601.

A set of seven registers 604 REG1 to REG7, each 32-bit wide, is available for storing data results RESULT from ALU 601. SELR, a 3-bit input from the MC bus, selects which one of the seven registers 604 is written to or read from at a given time; a binary value of 000'b indicates the value is output to the MI bus only. Results stored in the set of registers 604 may be selected as OPERAND_A or OPERAND_B for subsequent operations. SELA, a 3-bit input into mux 602 from the MC bus, is used to select the source of OPERAND_A. The source of OPERAND_A is selected is selected between one of the seven registers 604 and DATA_IN, a 32-bit input from the MC bus. Similarly, SELB, also supplied via the MC bus, is used to select the source of OPERAND_B at mux 603. The source of OPERAND_B is selected also between one of the seven registers 604 and DATA_IN. Another input into ALU 601 is the CIN input. Depending on the operation specified by the OPCODE, the CIN input may be used differently by the ALU 601. For 'addition' and 'subtraction' operations, the CIN input into ALU 601 may indicate a carry-in. SELCI, a 3-bit input into mux 607 from the MC bus, selects the source of CIN between one of the flag registers 606 and CIN[0] from the MC bus.

In addition to outputting data results RESULT, ALU 601 also outputs signals LOUT, EQZ, GTZ, and GEZ. Similar to CIN, the operation specified by the OPCODE determines what the values of LOUT may represent. For example, LOUT may indicate a carry-out for an 'addition' operation and a borrow-out for a 'subtraction' operation. Other exemplary functions of LOUT are listed in FIGS. 11 and 12. EQZ, GTZ, and GEZ indicate the comparison of the data result to zero as a two's complement. Assertion of EQZ indicates that the data result is equal to zero. Assertion of GTZ indicates that the data result value is greater than zero. Assertion of GEZ indicates that the data result value is greater than or equal to zero. SELCO, a 3-bit input into mux 608 from the MC bus, determines which one of the values LOUT, EQZ, GTZ, or GEZ is selected to FOUT and stored in the set of flag registers 606 for use in subsequent operations. Outputs RESULT, LOUT, EQZ, GTZ, and GEZ are driven on the MI bus in memory input registers (MI_REGS) and may be accessed by any one of the four processor clusters 501a-501d. FIG. 6 also illustrates a set of FSA registers 609 that may be used for communicating data between ALU0 module 507 and ALU1 module 508.

Arithmetic Operations

Figure 7:
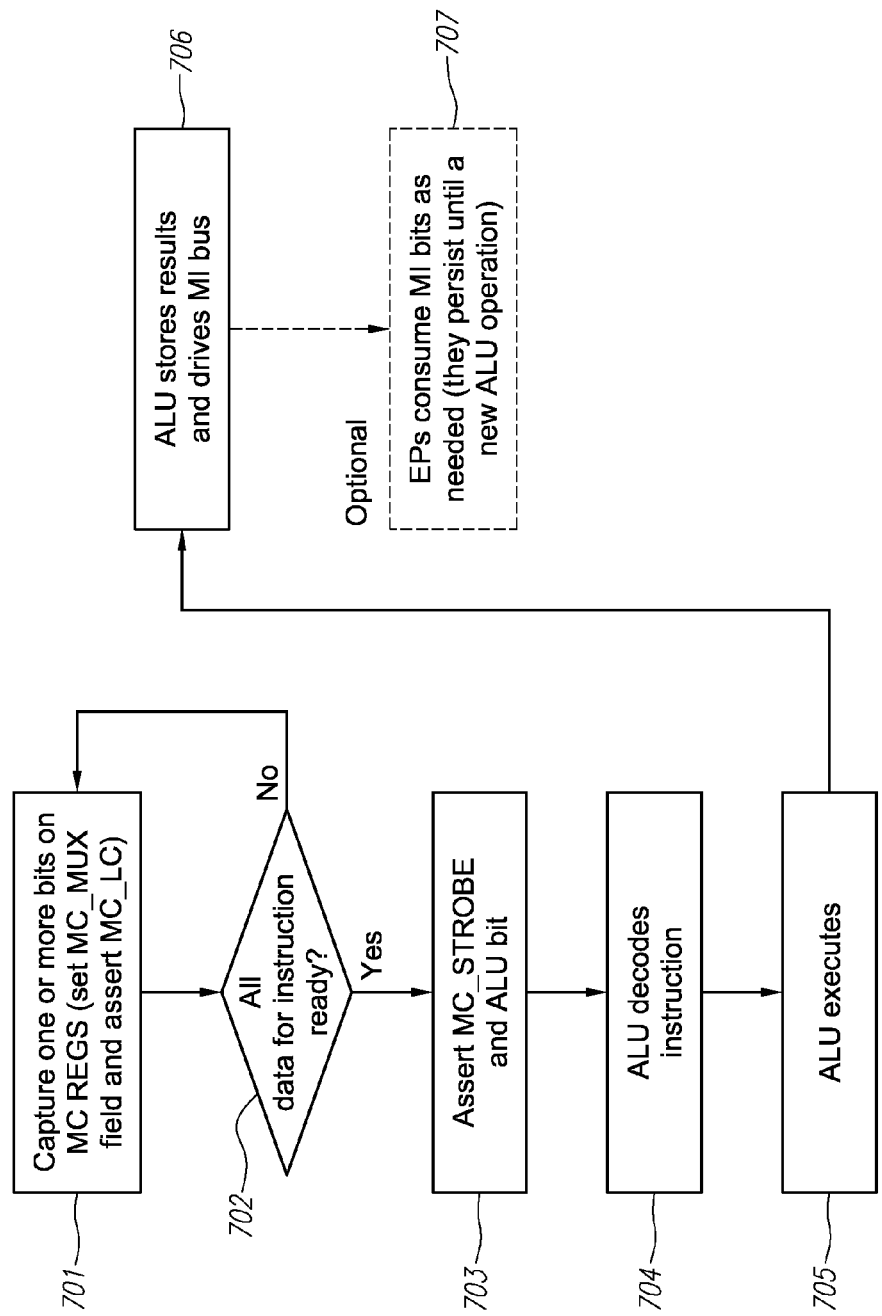
FIG. 7 illustrates exemplary steps for operating an ALU, according to one embodiment.

FIG. 7 illustrates exemplary steps for operating the ALU, according to one embodiment. At 701, one or more bits from the emulation processors are captured in MC_REGS. For each emulation step, the control word instruction for each processor may contain one or more fields indicating which bits are to be stored at which MC_REGS. A bit may be captured in an MC_REG, for instance, by setting the memory control mux (MC_MUX) signal and the memory control latch (MC_LC) signal for the corresponding processor. During the static scheduling (compiling) process at 702, the scheduler checks whether all the data and control signals necessary for accessing either ALU0 module 507 or ALU1 module 508 have been captured in MC_REGS. The scheduler continues to schedule the capturing of bits into the MC_REGS at 701 until all the necessary signals have been captured. Once all the necessary signals have been captured, the scheduler may schedule an instruction to cause the MC_STROBE bit to be asserted at 703. As mentioned earlier, asserting the MC_STROBE bit along with the ALU bit activates the ALU decode logic 504. After the ALU decode logic 504 is activated, the data and control signals from MC_REGS are communicated to the selected ALU block (ALU0 or ALU1). At 704, the ALU 601 decodes the OPCODE to determine the operation to be performed. In one instance, the ALU may determine the operation from the OPCODE by looking up the OPCODE in a function table or any synthesized logic. The ALU 601 executes the operation at 705. Results from the operation are stored in data registers 604 and flag register 606 at 706. The results are also driven on the MI bus in MI_REGS at 706. Data on the MI bus may be accessed by any one of the four processor clusters 501a-501d. Optional step 707 illustrates that the processor clusters access the data in MI_REGS as needed. The data may persist in the MI_REGS until a new ALU operation is performed.

Figure 8:
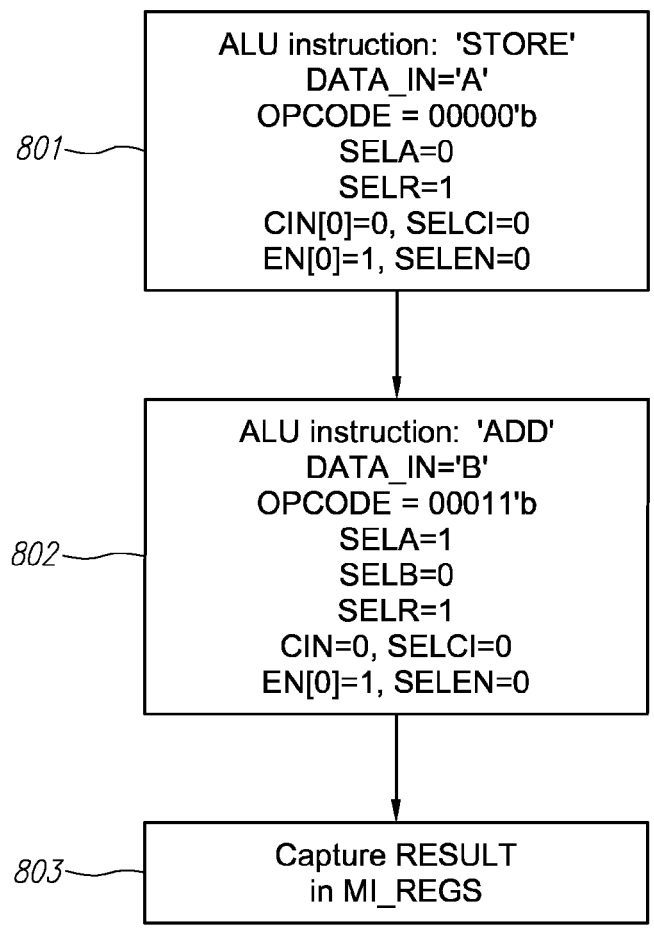
FIG. 8 illustrates exemplary steps for performing the addition operation 'A+B' with an ALU block, according to one embodiment.

FIG. 8 illustrates exemplary steps for performing an addition operation 'A+B' with an ALU block, according to one embodiment. At 801, the following data and control signals are asserted on the MC bus:

DATA_IN='A'
OPCODE = 00000'b
SELA=0
SELR=1
CIN[0]=0, SELCI=0
EN[0]=1, SELEN=0

Asserting SELA=0 selects DATA_IN='A' as the OPERAND_A input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00000'b corresponds to the 'STORE' instruction listed in FIGS. 11 and 12. The 'STORE' instruction, along with CIN=0, instructs the ALU 601 to output OPERAND_A as data result RESULT. Asserting SELR=1 selects REG1 of registers 604 as the destination for storing RESULT.

At 802, the following data and control signals are asserted on the MC bus:

DATA_IN='B'
OPCODE = 00011'b
SELA=1
SELB=0
SELR=1
CIN[0]=0, SELCI=0
EN[0]=1, SELEN=0

Asserting SELA=1 selects the previously stored value 'A' in REG1 as the OPERAND_A input for ALU 601. Asserting SELB=0 selects DATA_IN='B' as the OPERAND_B input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00011'b corresponds to the 'ADD' instruction listed in FIGS. 11 and 12. The 'ADD' instruction directs the ALU 601 to add the values from OPERAND_A, OPERAND_B, and CIN. At 803, the ALU 601 outputs the data result RESULT, along with COUT, onto the MI bus and is captured in the MI_REGS. COUT=1 if the result of the 'addition' operation results in a carry-out. Asserting SELR=1 selects REG1 of registers 604 as the destination for storing RESULT. Alternatively, RESULT may be driven on the MI bus without being stored in one of the registers 604 by asserting SELR=0.

Figure 9:
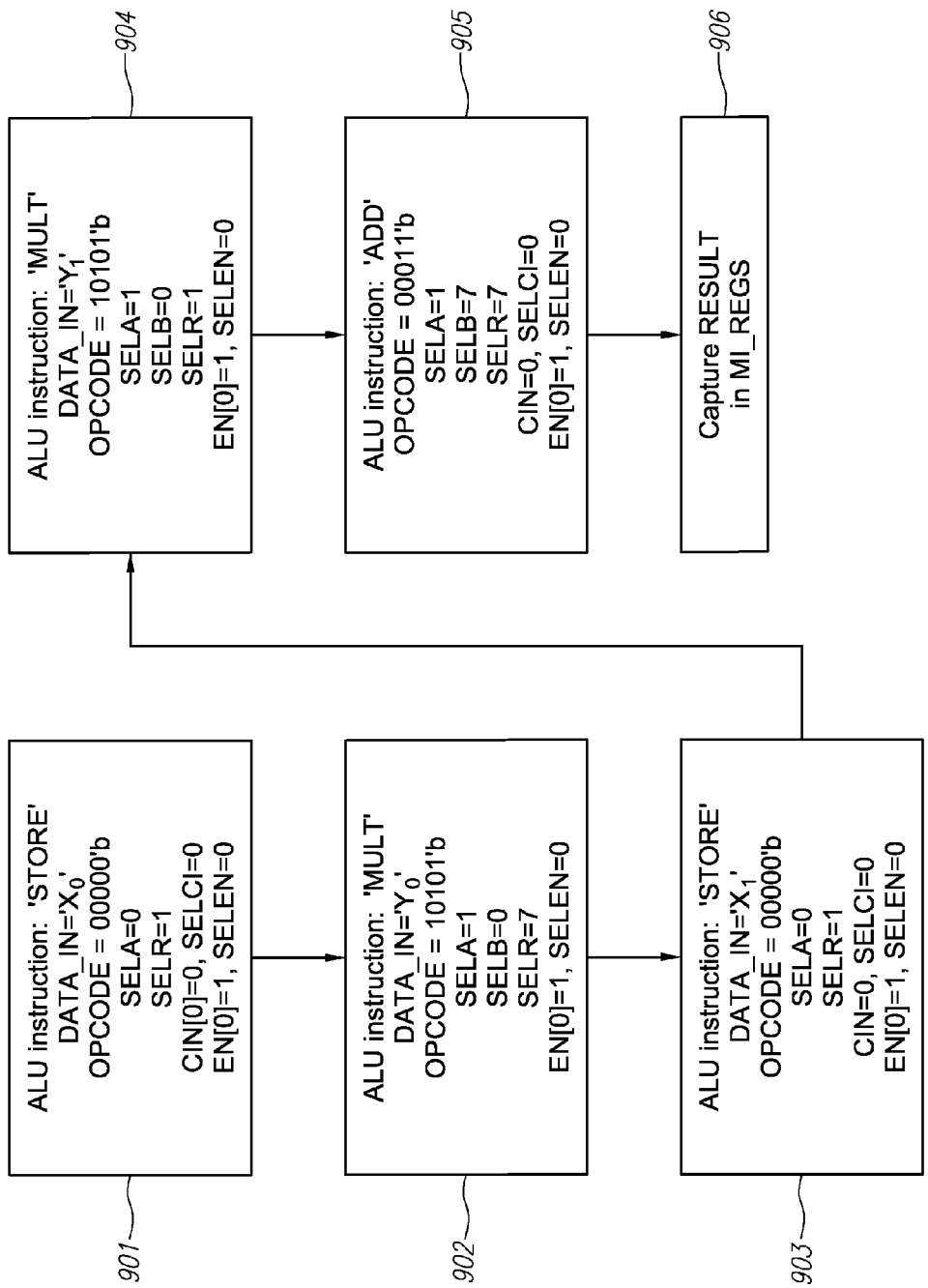
FIG. 9 illustrates exemplary steps for performing a multiply-accumulate operation '$X_0Y_0+X_1Y_1$' with an ALU block, according to one embodiment.

FIG. 9 illustrates exemplary steps for performing a multiply-accumulate operation '$X_0Y_0+X_1Y_1$' with an ALU block, according to one embodiment. At 901, the following data and control signals are asserted on the MC bus for storing '$X_0$' in REG1 of registers 604:

DATA_IN='$X_0$'
OPCODE = 00000'b
SELA=0
SELR=1
CIN[0]=0, SELCI=0
EN[0]=1, SELEN=0

Asserting SELA=0 selects DATA_IN='$X_0$' as the OPERAND_A input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00000'b corresponds to the 'STORE' instruction. The 'STORE' instruction, along with CIN=0, instructs the ALU 601 to output OPERAND_A as data result RESULT. Asserting SELR=1 selects REG1 of registers 604 as the destination for storing RESULT.

At 902, the following data and control signals are asserted on the MC bus for multiplying $Y_0$ with $X_0$ (stored in REG1 at 901):

DATA_IN='$Y_0$'
OPCODE = 10101'b
SELA=1
SELB=0
SELR=7
EN[0]=1, SELEN=0

Asserting SELA=1 selects the previously stored value '$X_0$' in REG1 as the OPERAND_A input for ALU 601. Asserting SELB=0 selects DATA_IN='$Y_0$' as the OPERAND_B input for ALU 601. Asserting SELEN=0 selects EN[0]=1 as the EN input for ALU 601, enabling execution of the instruction specified by the OPCODE. The OPCODE=10101'b corresponds to the 'MULT' instruction listed in FIGS. 11 and 12. The 'MULT' instruction directs the ALU 601 to multiply OPERAND_A with OPERAND_B and output the data result '$X_0Y_0$' as RESULT. Asserting SELR=7 selects REG7 of registers 604 as the destination for storing RESULT.

At 903, the following data and control signals are asserted on the MC bus for storing '$X_1$' in REG1 of registers 604:

```
DATA_IN='X₁'
OPCODE = 00000'b
SELA=0
SELR=1
CIN[0]=0, SELCI=0
EN[0]=1, SELEN=0
```

Asserting SELA=0 selects DATA_IN='$X_1$' as the OPERAND_A input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00000'b corresponds to the 'STORE' instruction. The 'STORE' instruction, along with CIN=0, instructs the ALU 601 to output OPERAND_A as data result RESULT. Asserting SELR=1 selects REG1 of registers 604 as the destination for storing RESULT.

At 904, the following data and control signals are asserted on the MC bus for multiplying $Y_1$ with $X_1$ (stored in REG1 at 901):

```
DATA_IN='Y₁'
OPCODE = 10101'b
SELA=1
SELB=0
SELR=1
EN[0]=1, SELEN=0
```

Asserting SELA=1 selects the previously stored value '$X_1$' in REG1 as the OPERAND_A input for ALU 601. Asserting SELB=0 selects DATA_IN='$Y_1$' as the OPERAND_B input for ALU 601. Asserting SELEN=0 selects EN[0]=1 as the EN input for ALU 601, enabling execution of the instruction specified by the OPCODE. The OPCODE=10101'b corresponds to the 'MULT' instruction listed in FIGS. 11 and 12. The 'MULT' instruction directs the ALU 601 to multiply OPERAND_A with OPERAND_B and output the data result '$X_1Y_1$' as RESULT. Asserting SELR=1 selects REG1 of registers 604 as the destination for storing RESULT.

At 905, the following data and control signals are asserted on the MC bus for adding '$X_0Y_0$' (stored in REG7) and '$X_1Y_1$' (stored in REG1):

```
OPCODE = 00011'b
SELA=1
SELB=7
SELR=7
CIN[0]=0, SELCI=0
EN[0]=1, SELEN=0
```

Asserting SELA=1 selects the previously stored value in REG1 as the OPERAND_A input for ALU 601. Asserting SELB=0 selects the previously stored value '$X_0Y_0$' in REG7 as the OPERAND_B input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00011'b corresponds to the 'ADD' instruction. The 'ADD' instruction directs the ALU 601 to add the values OPERAND_A, OPERAND_B, and CIN and output the result '$X_0Y_0+X_1Y_1$' as RESULT. At 906, the data result RESULT, along with COUT, is captured on the MI_REGS of the MI bus. COUT=1 if the result of the 'addition' operation results in a carry-out. Asserting SELR=7 selects REG7 of registers 604 as the destination for storing RESULT.

Other Operations

Figure 10:
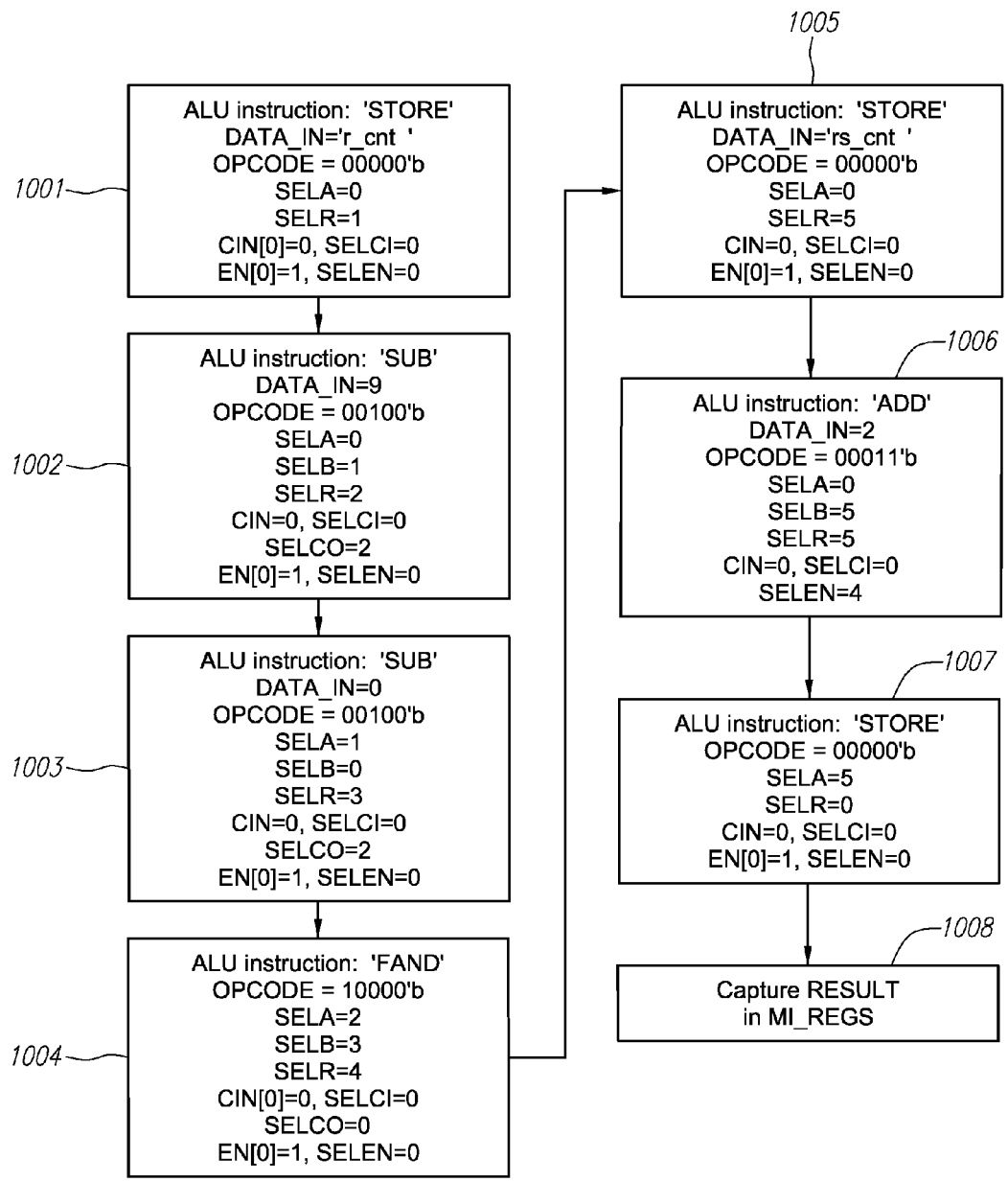
FIG. 10 illustrates exemplary steps for utilizing the ALU to evaluate the conditional statement found in FIG. 1.

In addition to performing arithmetic operations, ALU 601 is also capable of performing other complex operations that would otherwise require substantial emulated hardware resources to perform. These complex operations include evaluating complex logical operations, conditional operations, linear shift operations, and counting operations. For instance, FIG. 10 illustrates exemplary steps for utilizing ALU 601 to evaluate the conditional statement found in FIG. 1. The conditional statement, restated below, involves arithmetic comparisons 104 and 105, logical combinations 106 and 107, and arithmetic operation 103.

```
if (r_cnt > 0 && r_cnt < 9) begin
    rs_cnt <= rs_cnt + 2;
end
```

Logical combination 107 specifies testing two arithmetic comparisons to determine whether each condition is true or false: (1) is r_cnt greater than zero? and (2) is r_cnt is less than nine? Testing each of these two conditions necessitates evaluating arithmetic comparisons 104 and 105. Next, these two conditions are combined via logical combination 106. If both conditions test to be true, then arithmetic operation 103 is evaluated. Otherwise, arithmetic operation 103 is not evaluated.

At 1001, the following data and control signals are asserted on the MC bus to store the value 'r_cnt' in REG1 of registers 604:

```
DATA_IN='r_cnt'
OPCODE = 00000'b
SELA=0
SELR=1
CIN[0]=0, SELCI=0
EN[0]=1, SELEN=0
```

Asserting SELA=0 selects DATA_IN='r_cnt' as the OPERAND_A input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00000'b corresponds to the 'STORE' instruction listed in FIGS. 11 and 12. The 'STORE' instruction, along with CIN=0, instructs the ALU 601 to output OPERAND_A as data result RESULT. Asserting SELR=1 selects REG1 of registers 604 as the destination for storing RESULT.

Note, ALU 601 evaluates an arithmetic comparison, '9>r_cnt', first by reducing it into the form '9−r_cnt>0' through subtraction. Thus, at 1002, the following data and control signals are asserted on the MC bus to subtract 'r_cnt' (previously stored in REG1 at 1001) from '9':

```
DATA_IN=9
OPCODE = 00100'b
SELA=0
SELB=1
SELR=2
CIN[0]=0, SELCI=0
SELCO=2
EN[0]=1, SELEN=0
```

Asserting SELA=0 selects DATA_IN=9 as the OPERAND_A input for ALU 601. Asserting SELB=1 selects the previously stored value 'r_cnt' in REG1 as the OPERAND_B input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00100'b corresponds to the 'SUB' instruction listed in FIGS. 11 and 12. The 'SUB' instruction directs the ALU 601 to subtract OPERAND_B ('r_cnt') and CIN (0) from OPERAND_A (9). The data result of the operation, RESULT, is compared to zero. The GTZ flag indicates whether RESULT is greater than zero. Asserting SELCO=2 selects GTZ as FOUT while asserting SELR=2 selects flag register F2 of flag registers 606 as the destination for storing FOUT.

At 1003, the following data and control signals are asserted on the MC bus to subtract '0' from 'r_cnt' (previously stored in REG1 at 1001):

```
DATA_IN=0
OPCODE = 00100'b
SELA=1
SELB=0
SELR=3
CIN[0]=0, SELCI=0
SELCO=2
EN[0]=1, SELEN=0
```

Asserting SELA=1 selects the previously stored value 'r_cnt' in REG1 as the OPERAND_A input for ALU 601. Asserting SELB=0 selects DATA_IN=0 as the OPERAND_B input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00100'b corresponds to the 'SUB' instruction listed in FIGS. 11 and 12. The 'SUB' instruction directs the ALU 601 to subtract OPERAND_B (0) and CIN (0) from OPERAND_A ('r_cnt'). The data result of the operation, RESULT, is compared to zero. Asserting SELCO=2 selects GTZ as FOUT while asserting SELR=3 selects flag register F3 of flag registers 606 as the destination for storing FOUT.

F2 now contains the GTZ flag value indicating whether '9>r_cnt' is true while register F3 contains the GTZ flag value indicating whether 'r_cnt>0' is true. Thus, the logical combination 106 'r_cnt>0 && r_cnt<9' may be carried out by performing an 'and' operation on the values in registers F2 and F3 of flag registers 606. At 1004, the following data and control signals are asserted on the MC bus:

```
OPCODE = 10000'b
SELA=2
SELB=3
SELR=4
CIN[0]=0, SELCI=0
SELCO=0
EN[0]=1, SELEN=0
```

Asserting SELA=2 selects the F2 flag register as the source of OPERAND_A input for ALU 601. Asserting SELB=3 selects the F3 flag register as the source of OPERAND_B input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=10000'b corresponds to the 'FAND' instruction listed in FIGS. 11 and 12. The 'FAND' instruction directs the ALU 601 to logically 'and' OPERAND_A and OPERAND_B. The result of the 'FAND' operation is outputted to COUT. Asserting SELCO=0 selects COUT as FOUT while asserting SELR=4 selects register F4 of flag registers 606 as the destination for storing FOUT.

At 1005, the following data and control signals are asserted on the MC bus to setup the operand values for executing arithmetic operation 103 by storing the value 'rs_cnt' in REG5 of registers 604:

```
DATA_IN='rs_cnt'
OPCODE = 00000'b
SELA=0
SELR=5
CIN[0]=0, SELCI=0
EN[0]=1, SELEN=0
```

Whether the arithmetic operation 103 will actually be executed is determined later at 1006. Asserting SELA=0 selects DATA_IN='rs_cnt' as the OPERAND_A input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00000'b corresponds to the 'STORE' instruction listed in FIGS. 11 and 12. The 'STORE' instruction, along with CIN=0, instructs the ALU 601 to output OPERAND_A as data result RESULT. Asserting SELR=5 selects REG5 of registers 604 as the destination for storing RESULT.

At 1006, the following data and control signals are asserted on the MC bus to setup ALU 601 for adding 'rs_cnt' (previously stored in REG5 at 1005) to '2':

```
DATA_IN='2'
OPCODE = 00011'b
SELA=0
SELB=5
SELR=5
CIN[0]=0, SELCI=0
SELEN=4
```

Asserting SELA=0 selects DATA_IN='2' as the OPERAND_A input for ALU 601. Asserting SELB=5 selects the previously stored value '2' in REG5 as the OPERAND_B input for ALU 601. Asserting SELCI=0 selects CIN[0]=0 as the CIN input for ALU 601. Asserting SELEN=4 selects register F4 as the source of EN input for ALU 601. As previously shown at 1004, flag register F4 contains the value indicating whether the condition 'r_cnt>0 && r_cnt<9' is true. If the condition is true (for instance, F4=1), then execution of the instruction specified by the OPCODE is enabled. Otherwise, execution is disabled, and ALU 601 does not perform the operation specified by the OPCODE. The OPCODE=00011'b corresponds to the 'ADD' instruction listed in FIGS. 11 and 12. The 'ADD' instruction directs the ALU 601 to add the values from OPERAND_A, OPERAND_B, and CIN. Thus, by relying on the flag register (as the EN input) to determine whether the instruction (arithmetic operation 103) is executed, the logical combination 107 is carried out. COUT=1 if the result of the 'addition' operation results in a carry-out. Asserting SELR=5 selects REG5 of registers 604 as the destination for storing RESULT.

Because the instruction specified by the OPCODE at 1006 may not be executed, a STORE operation may be executed to drive 'rs_cnt' air back to the emulation processors at 1007, by asserting the following data and control signals on the MC bus to:

```
OPCODE = 00000'b
SELA=5
SELR=0
CIN[0]=0, SELCI=0
EN[0]=1, SELEN=0                    5
```

Asserting SELA=5 selects REG5 ('rs_cnt') as the OPERAND_A input for ALU 601. Asserting SELCI=0 selects CIN[0]=0 as the CIN input for ALU 601. Asserting SELEN=0 selects EN[0]=1 as the EN input for ALU 601, enabling execution of the instruction specified by the OPCODE. The OPCODE=00000'b corresponds to the 'STORE' instruction listed in FIGS. 11 and 12. The 'STORE' instruction, along with CIN=0, instructs the ALU 601 to output OPERAND_A as data result RESULT. Asserting SELR=0 drives the RESULT on the MI bus without storing it in one of the registers 604. The data result RESULT, along with COUT, is captured in the MI_REGS at 1008.

As the exemplary steps in FIG. 10 illustrate, logical operations may be performed on flag register bits, without altering them, to create complex conditions for executing instructions. Flag operations supported by ALU 601 include 'FSTORE', 'FAND', 'FOR', 'FANDB', and 'FXOR'. 'FSTORE' instructs ALU 601 to store a flag bit value to a specified flag register. 'FAND' instructs ALU 601 to logically 'and' two specified flag register values. 'FOR' instructs ALU 601 to logically 'or' two specified flag register values. 'FANDB' instructs ALU 601 to logically 'and' one specified flag register value and the logical negation of another specified flag register value. 'FXOR' instructs ALU 601 to logically 'xor' two specified flag register values.

Other functions supported by ALU 601 include 'FSAWR', 'FSARD', 'FSATST', 'LBRANCH', 'CNT1', 'RIGHT1', and 'LFSR', which are listed in FIGS. 11 and 12. Functions 'FSAWR', 'FSARD', 'FSATST', and 'LBRANCH' support communication between two ALU's within an emulation chip via a flexible stepping architecture (FSA). Examples of a flexible stepping architecture are disclosed in copending U.S. application Ser. No. 11/444,032, entitled "Method and Apparatus for Synchronizing Processors in a Hardware Emulation System", which is herein incorporated by reference. 'FSAWR' instructs ALU 601 to write data selected by SELB to a local FSA register selected by SELA and to set a semaphore. 'FSARD' instructs ALU 601 to read data from a remote FSA register selected by SELA and to unset the semaphore. 'FSATST' instructs ALU 601 to read the state of the semaphore without altering its value. 'LBRANCH' instructs ALU 601 to load the FSA Branch register with a branch address from OPERAND_A. 'CNT1' represents a bit counting operation and instructs ALU 601 to count the number of ones occurring in OPERAND_A. 'RIGHT1' instructs ALU 601 to return the index of the rightmost '1' occurring in OPERAND_A. 'LFSR' instructs ALU 601 to apply a Linear Feedback Shift Register (LFSR) function to OPERAND_A, OPERAND_B, and CIN to generate RESULT and COUT. LFSR functions are often used for generating pseudo-random number sequences.

Embodiments and methods as described herein have significant advantages over prior art implementations. As will be apparent to one of ordinary skill in the art, other similar arrangements are possible within the general scope. The embodiments and methods described above are intended to be exemplary rather than limiting, and the bounds should be determined from the claims.

I claim:

1. An emulation chip for verifying the functionalities of a user's electronic circuit design, comprising:
    hardware logic emulation resources that emulate at least a portion of the user's electronic circuit design, wherein the user's electronic circuit design is mapped to the hardware logic emulation resources that evaluate a plurality of Boolean equations, and wherein the hardware logic emulation resources generate a plurality of data bits and a plurality of control bits during emulation of the user's electronic circuit design to control the evaluation of an arithmetic operation;
    a decode circuit to generate an arithmetic evaluation instruction using the plurality of data bits and the plurality of control bits; and
    a first hardware arithmetic logic unit (ALU) block formed on the emulation chip, the first hardware ALU block including a hardware arithmetic logic unit that performs the arithmetic operation or a complex logical operation during emulation of the user's electronic circuit design in response to the arithmetic evaluation instruction and generates a return value provided to the hardware logic emulation resources.

2. The emulation chip of claim 1, the first hardware ALU block further including a set of flag registers that contains a conditional value for enabling the hardware arithmetic logic unit or modifying its behavior.

3. The emulation chip of claim 1, wherein the hardware logic emulation resources include a plurality of emulation processors.

4. The emulation chip of claim 1, wherein the first hardware ALU block shares a memory control bus with one or more memory elements.

5. The emulation chip of claim 1, wherein the output of the first hardware ALU block is driven on a memory input bus and made available to the hardware logic emulation resources.

6. The emulation chip of claim 5, further comprising a memory input encoder that replicates the output of the first hardware ALU block on the memory input bus.

7. The emulation chip of claim 4, wherein the hardware logic emulation resources communicate instructions and data to the first hardware ALU block using the memory control bus.

8. The emulation chip of claim 7, wherein the instructions include an opcode that represents the arithmetic operation or the complex logical operation performed by the hardware arithmetic logic unit.

9. The emulation chip of claim 1, wherein the hardware arithmetic logic unit performs a flag operation on at least one flag register of a set of flag registers to create a conditional value.

10. The emulation chip of claim 1, the first hardware ALU block further including a set of synchronization registers and a semaphore that are accessible to a second hardware ALU block.

11. The emulation chip of claim 10, wherein the semaphore is set when data is written to the set of synchronization registers by the first hardware ALU block.

12. The emulation chip of claim 10, wherein the semaphore is unset when data is read from the set of synchronization registers by the second hardware ALU block.

13. The emulation chip of claim 1, wherein the complex logical operation includes at least one of a linear feedback shift operation, arithmetic comparison operation, a branch address load operation, and a bit counting operation.

14. The emulation chip of claim 1, wherein a static scheduler schedules and assigns the arithmetic operation or the complex logical operation to the first hardware ALU block at compile time.

15. A method for verifying the functionalities of a user's electronic circuit design using a hardware logic emulation system comprising a plurality of emulation chips, wherein the emulation chips have hardware logic emulation resources, and wherein the user's electronic circuit design is mapped into the hardware logic emulation resources of the emulation chips, comprising:
    emulating at least a portion of the user's electronic circuit design, wherein the user's electronic circuit design is mapped onto hardware logic emulation resources;
    accessing during emulation of the portion of the user's electronic circuit design a conditional value from a set of flag registers to enable a first hardware arithmetic logic unit formed on an emulation chip of the plurality of emulation chips;
    receiving an opcode that represents an arithmetic operation or a complex logical operation of the user's electronic circuit design;
    executing the arithmetic operation or complex logical operation on the first hardware arithmetic logic unit during emulation in response to the opcode, wherein the first hardware arithmetic logic unit is used in addition to the hardware logic emulation resources; and driving the output of the first hardware arithmetic logic unit on a memory input bus to the hardware logic emulation resources.

16. The method of claim 15 further comprising accessing a conditional value from a set of flag registers to enable the first hardware arithmetic logic unit or otherwise modify its behavior.

17. The method of claim 15, wherein the hardware logic emulation resources include a plurality of emulation processors.

18. The method of claim 15, wherein the opcode is received from a memory control bus that is shared with one or more memory elements.

19. The method of claim 15, further comprising replicating the output of the first hardware arithmetic logic unit on the memory input bus.

20. The method of claim 15, wherein accessing the conditional value includes performing a flag operation on at least one flag register of a set of flag registers to generate the conditional value.

21. The method of claim 15, further comprising writing data to a set of synchronization registers that is accessible to a second hardware arithmetic logic unit.

22. The method of claim 21, wherein writing data to the set of synchronization registers includes setting a semaphore.

23. The method of claim 22, further comprising reading data from the set of synchronization registers and unsetting the semaphore.

24. The method of claim 15, wherein executing a complex logical operation includes executing at least one of a linear feedback shift operation, arithmetic comparison operation, a branch address load operation, and a bit counting operation.

25. The method of claim 15, wherein a static scheduler schedules and assigns the arithmetic operation or the complex logical operation to the first hardware arithmetic logic unit at compile time.

26. A hardware emulation system for verifying the functionalities of a user's electronic circuit design, comprising:
    a control card configured to communicate with a host workstation;
    a plurality of emulation chips in communication with the control card, an emulation chip of the plurality of emulation chips comprising:
        hardware logic emulation resources that emulate at least a portion of the user's electronic circuit design, wherein the user's electronic circuit design is mapped to the hardware logic emulation resources that evaluate a plurality of Boolean equations, and wherein the hardware logic emulation resources generate a plurality of data bits and a plurality of control bits during emulation of the user's electronic circuit design to control the evaluation of an arithmetic operation or a complex logical operation;
        a decode circuit to generate an evaluation instruction using the plurality of data bits and the plurality of control bits; and
        a first hardware arithmetic logic unit (ALU) block formed on the emulation chip, wherein the first hardware ALU block includes a hardware arithmetic logic unit that performs the arithmetic operation or the complex logical operation of the portion of the user's electronic circuit design in response to the evaluation instruction and generates a return value provided to the hardware logic emulation resources.

27. The system of claim 26, the first hardware ALU block further including a set of flag registers that contains a conditional value for enabling the hardware arithmetic logic unit or modifying its behavior.

28. The system of claim 26, wherein the hardware logic emulation resources include a plurality of emulation processors.

29. The system of claim 26, wherein the first hardware ALU block shares a memory control bus with one or more memory elements.

30. The system of claim 26, wherein the output of the first hardware ALU block is driven on a memory input bus and made available to the hardware logic emulation resources.

31. The system of claim 30, further comprising a memory input encoder that replicates the output of the first hardware ALU block on the memory input bus.

32. The system of claim 29, wherein the hardware logic emulation resources communicate instructions and data to the first hardware ALU block using the memory control bus.

33. The system of claim 32, wherein the instructions include an opcode that represents the arithmetic operation or the complex logical operation performed by the hardware arithmetic logic unit.

34. The system of claim 26, wherein the hardware arithmetic logic unit performs a flag operation on at least one flag register of a set of flag registers to create a conditional value.

35. The system of claim 26, the first hardware ALU block further including a set of synchronization registers and a semaphore that are accessible to a second hardware ALU block.

36. The system of claim 35, wherein the semaphore is set when data is written to the set of synchronization registers by the first hardware ALU block.

37. The system of claim 35, wherein the semaphore is unset when data is read from the set of synchronization registers by the second hardware ALU block.

38. The system of claim 26, wherein the complex logical operation includes at least one of a linear feedback shift operation, arithmetic comparison operation, a branch address load operation, and a bit counting operation.

39. The system of claim 26, wherein a static scheduler schedules and assigns the arithmetic operation or the complex logical operation to the first hardware ALU block at compile time.

* * * * *